Feb. 14, 1961

N. R. NEWMAN

APPARATUS FOR CUTTING AND FORMING LEADS OF ELECTRONIC COMPONENTS 2,971,544

Filed Jan. 16, 1951

2 Sheets-Sheet 1

Norman R. Newman
Inventor

By G. D. O'Brien

Attorney

Feb. 14, 1961 N. R. NEWMAN 2,971,544

APPARATUS FOR CUTTING AND FORMING LEADS OF ELECTRONIC COMPONENTS

Filed Jan. 16, 1951 2 Sheets-Sheet 2

Norman R. Newman
Inventor

By [signature]

Attorney

United States Patent Office 2,971,544

Patented Feb. 14, 1961

2,971,544

APPARATUS FOR CUTTING AND FORMING LEADS OF ELECTRONIC COMPONENTS

Norman R. Newman, Rochester, N.Y., assignor, by mesne assignments, to the United States of America as represented by the Secretary of the Navy Filed Jan. 16, 1951, Ser. No. 206,143

3 Claims. (Cl. 140—71)

Figure 7:
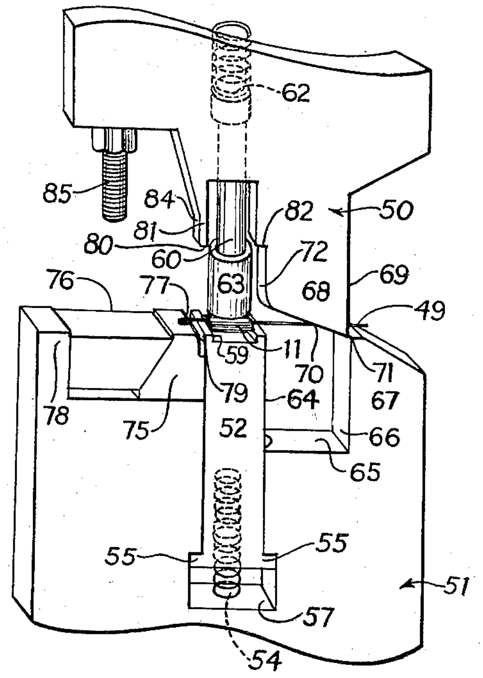

This invention relates to apparatus for cutting and forming the lead-in conductors of electronic components. Such lead-in conductors will hereinafter be generically referred to as leads.

Miniaturized electronic circuits in which the components are embedded in plastic eliminates the conventional chassis and mountings and allows the use of bare point-to-point wiring for rapid circuit assembly. To provide stabilization of electrical performance, it is necessary that electronic components occupy the same relative positions from unit to unit. Even with highly trained personnel it is difficult to maintain uniformity of construction if the leads are cut and formed manually. Open and close hooks, pigtail windings and right angle bends are formed differently from operator to operator and from time to time by the same operator. To consistently maintain high quality electrical performance in mass-produced miniaturized electronic assemblies, it is highly desirable that the component leads be cut and formed in exactly the same manner from unit to unit.

It is an object of the invention to provide apparatus for cutting electric component leads to predetermined lengths and for forming flat loops and right angle bends in the predetermined lengths.

It is a further object of the invention to provide such apparatus which will consistently produce uniform loops and bends in the leads.

It is also an object of the invention to provide apparatus which in a single motion will cut an electronic component lead to a predetermined length and form a flat loop in the predetermined length.

It is a still further object of the invention to provide apparatus which will cut one lead of an electric component to a predetermined length and simultaneously form right angle bends in opposite directions in the predetermined length and in a second lead.

Briefly, means are provided for supporting an electronic component with one lead against a pin and against a shearing edge which is spaced a predetermined distance from the body of the component, and a member rotatable about the pin is adapted to engage and shear the lead against the shearing edge and to carry the predetermined length around the pin to form a loop therein. A second unformed lead of the component is cut to a desired length and the first and second leads are bent in opposite directions in a pair of cooperating bending and shearing members reciprocable toward each other.

In the preferred embodiment of the invention, the first lead of an electronic component, e.g., a cylindrical resistor, is cut to a predetermined length and formed into a flat loop in flat support means having a stop against which the body of the resistor is placed and a centering pin and a shearing edge spaced a predetermined distance from and aligned with the stop so that the straight lead of the resistor abuts against the pin and the shearing edge. A reciprocable cutting and forming member engaging and rotatable about the centering pin is contiguous to the shearing edge when rotated and adapted to engage the lead when reciprocated, and means are provided to rotate the cutting and forming member in a direction to shear this lead against the shearing edge and to carry the predetermined length around the pin forming a loop therein. A forming and shearing punch and die reciprocable toward each other and provided with secondary support means for resiliently supporting the component are adapted to cut an unformed second lead to a predetermined length and to bend the first and second leads at right angles and in opposite directions.

Figure 8:
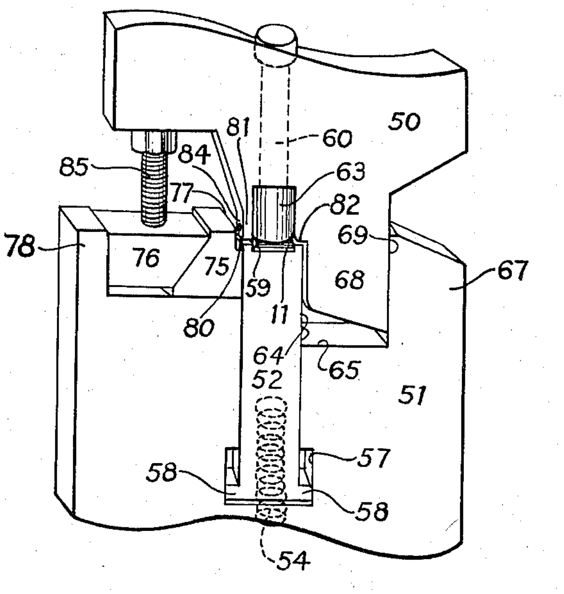
Figures 1, 2, 3A, 3B, 3C, 4, 5, 6:
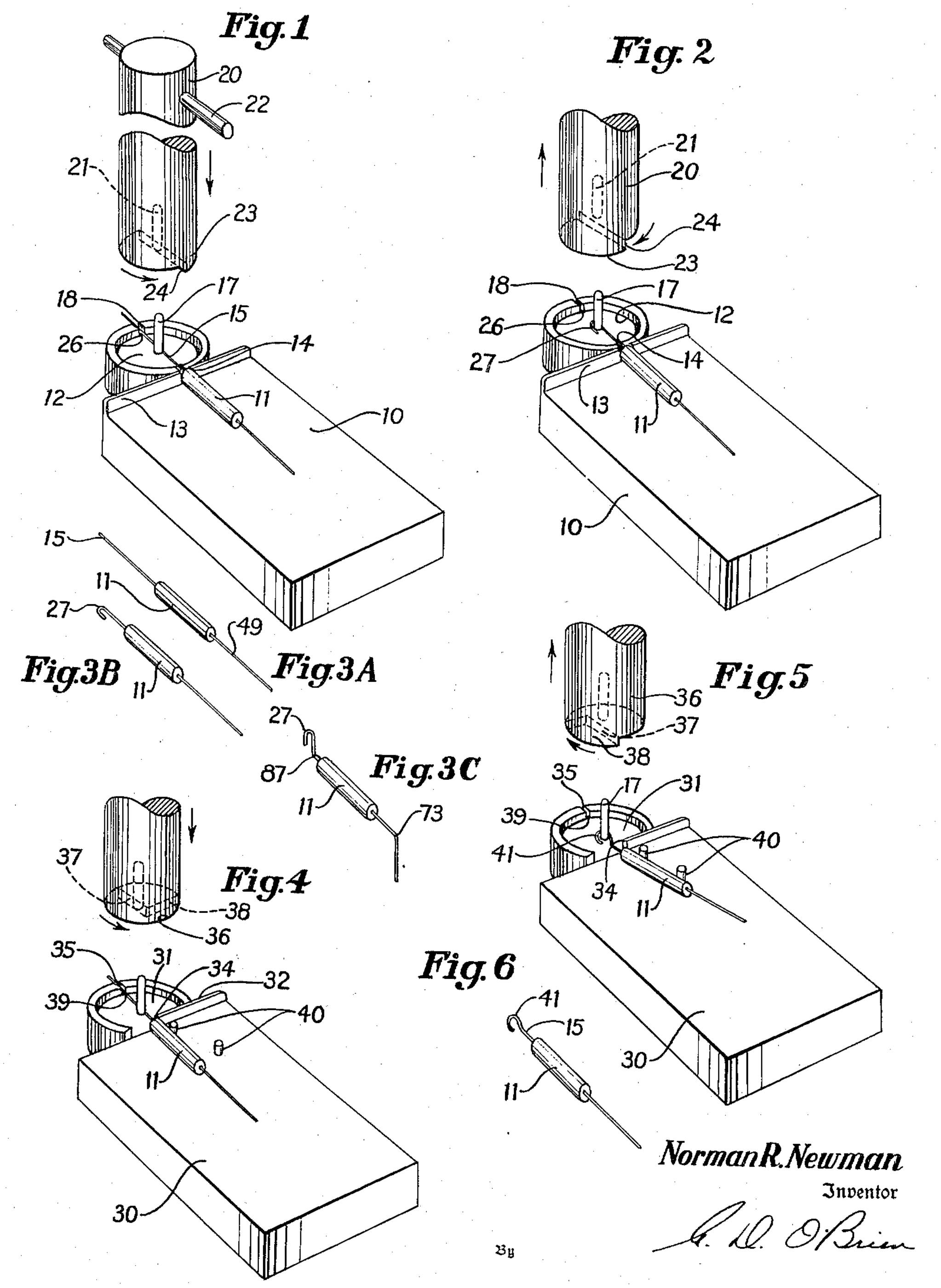

Other objects and advantages of the invention will be apparent from the accompanying drawing and the detailed description wherein:

Figs. 1 and 2 are perspective views showing the initial and operated positions respectively of the preferred embodiment of apparatus adapted to cut the first lead of an electronic component to a predetermined length and to form a flat loop therein;

Figs. 3A, 3B, and 3C are views in perspective illustrating the bends and loops formed sequentially in the leads of an electronic component at the different stages of the preferred embodiment of the invention;

Figs. 4 and 5 are perspective views showing the initial and operated positions respectively of an alternative embodiment of the apparatus shown in Figs. 1 and 2 which is adapted to center the loop formed in the component lead;

Fig. 6 is a perspective view of an electronic component in one lead of which a centered loop has been formed in the apparatus of Figs. 4 and 5; and Figs. 7 and 8 are perspective views showing the initial and operated positions respectively of the preferred embodiment of apparatus adapted to cut the second lead of an electronic component to a predetermined length and to form right angle bends in opposite directions in the first and second leads.

In the preferred embodiment of the invention illustrated in Fig. 1, a flat receiving base 10 for supporting an electronic component 11 is provided with a circular cylindrical recess 12 and an upwardly extending stop 13 having a slot 14 adapted to receive a lead 15 of the electronic component 11. To simplify the description and to facilitate the understanding of the invention, the preferred embodiment is shown in the drawing and hereinafter described as adapted to sever and form the leads of a specific electronic component 11, i.e., a cylindrical resistor with two flexible axial leads. However, it is to be understood that the invention is not limited to apparatus for cutting and forming the leads of such a resistor, or to a component with only two leads, but is readily adaptable to any small electronic component with flexible leads, for example, miniature capacitors, choke coils, varistors, or subminiature type radio tubes. An upwardly extending centering pin 17 is provided in the base 10 axially of the circular cylindrical recess 12, and a second slot 18 also adapted to receive the lead 15 is disposed substantially diametrically opposite from the slot 14 across the circular cylindrical recess 12 so that the lead 15 rests in both slots 14 and 18 and is tangential of the pin 17 when the body of the resistor 11 is against and substantially at right angles to the stop 13. The intersection of the wall of the cylindrical recess 12 with a wall of the groove 18 forms a shearing edge 26 against which the lead 15 is severed as hereinafter described. The shearing edge 26 is spaced from the stop 13 by the predetermined length to which the lead 15 is to be severed.

A vertical, reciprocable, right-circular cylindrical forming and shearing rod 20 fitting snugly within the circular recess 12 is provided with an axial bore 21 of sufficient size to receive the centering pin 17, and a handle 22 engaging and perpendicular to the rod 20 is provided to allow manual rotation of the forming rod 20 about the centering pin 17. A cutting head 23 extending downwardly from the rod 20 is provided with a vertical face 24 extending along an imaginary chord of a horizontal cross-section through the cylindrical rod 20 with the face 24 spaced from the circumference of the bore 21 by at least the diameter of the lead 15. The forming and shearing rod 20 is reciprocable vertically as shown by an arrow in Fig. 1 to a position wherein the centering pin 17 engages the bore 21 and the vertical face 24 abuts against the lead 15 away from the centering pin 17. Rotation of the forming and shearing rod 20 in a counterclockwise direction shown by an arrow in Fig. 1 shears the lead 15 between the vertical face 24 of the cutting head 23 and the shearing edge 26. Continued counterclockwise rotation of the forming rod 20 carries the predetermined length of the lead 15 around the centering pin 17 forming a flat loop 27 therein. The resistor 11 with the flat loop 27 formed around the centering pin 17 is shown in Fig. 2 which illustrates the operated position of the apparatus shown in Fig. 1. The rod 20 is rotated clockwise and reciprocated vertically by the handle 22 in the arrow directions shown in Fig. 2 to return the apparatus to its initial position. The resistor 11 with a half loop 27 formed in the lead 15 is illustrated in Fig. 3B.

It is evident that means other than the handle 22 may be utilized to rotate and reciprocate the forming and shearing rod 20. For example, the rod 20 may be affixed to a lever, a gear, or a friction clutch and may be manually or automatically driven by means well known in the art; in like manner, the apparatus may be returned from its operated to its initial position by well known spring, cam, or similar means. The appended claims are intended to cover all such modifications.

Figs. 4 and 5 illustrate, in the initial and operated positions respectively, an alternative construction of the embodiment shown in Figs. 1 and 2 which is particularly adapted to center the loop formed in the lead 15. A base 30 is provided with a recess 31 which is circularly-cylindrical except for a wall thereof formed by an upwardly extending stop 32 which is disposed along an imaginary chord of a cross-section through the circularly-cylindrical portion of recess 31. The stop 32 ends approximately midway of this imaginary chord to provide a vertical edge 34 against which the body of the resistor 11 is placed. A centering pin 17 is provided in the base 30 axial of the circularly-cylindrical portion of the recess 31, and a slot 35 adapted to receive the lead 15 is positioned approximately diametrically opposite from the vertical edge 34 so that a lead 15 disposed therein is tangential of the centering pin 17 and the vertical edge 34. A forming and shearing rod 36 is identical to the rod 20 of the embodiment of Figs. 1 and 2 except that the vertical face 37 of the cutting head 38 extends only partly along an imaginary chord of a circular cross-section through the rod 36. The lead 15 of the resistor 11 is sheared by rotation of the forming and shearing rod 36 against a shearing edge 39 formed by the intersection of a wall of the slot 35 and the wall of the recess 31 and spaced a predetermined distance from the stop 32 in exactly the same manner that the lead 15 is sheared against the edge 26 in the construction shown in Figs. 1 and 2; in like manner, the predetermined length is carried around the centering pin 17 to form a half loop 41 therein.

The base 30 is provided with a plurality of upwardly extending lugs 40 disposed in a line oblique to a line through the slot 35 and tangential of the pin 17 and of the vertical edge 34. The body of the resistor 11 is held against the stop 32 and against the lugs 40 as the shearing and forming rod 36 is rotated to sever the lead 15 and to carry the predetermined length thereof around the pin 17 to form a centered half loop 41 therein. The angle of inclination between these two lines is such that the axis of the loop 41 perpendicularly intersects the axis of the body of the resistor 11 as shown in Fig. 5 which illustrates the operated position of the apparatus. Fig. 6 illustrates the resistor 11 with the centered half loop 41 formed in the lead 15.

Figs. 7 and 8 show, in the initial and operated positions respectively, the preferred embodiment of a pair of cooperating members reciprocable toward each other and adapted to sever a second lead 49 of the resistor 11 at a predetermined length and to form right angle bends in opposite directions (as shown in Fig. 3C) in this predetermined length and in the lead 15 with the half loop 27 formed therein. To facilitate the understanding of the invention, side plates provided to prevent lateral movement of the movable parts of a forming and shearing punch 50 and a mating die 51 have been omitted from the drawing. A vertically-reciprocable slide 52 keyed to the die 51 throughout a portion of its length is resiliently restrained against downward movement by a compression spring 54 and limited in upward movement by outwardly extending flanges 55 on the lower portion thereof which are vertically movable within a rectangular aperture 57 in the die 51.

A U-shaped recess 59 for receiving the resistor 11 is provided in the top face of the slide 52 with the distance between the uprights of the U slightly greater than the length of the body of the resistor 11 and with the height of the uprights equal to the radial distance between the circumference of a lead and the circumference of the body of the resistor 11. A vertical rod 60 movable within an aperture provided in the punch 50 directly above the slide 52 is resiliently restrained against upward motion by a compression spring 62. The rod 60 widens near the lower end into a cylindrical retaining portion 63 slightly smaller in diameter than the length of the recess 59. The rod 60 and the slide 52 are thus resiliently urged toward each other and cooperate to support a resistor 11 with the body thereof held in the recess 59 by the retaining portion 63 and with the leads 15 and 49 resting on the top face of the slide 52.

A vertical side 64 of the slide 52 forms one upright of a U-shaped aperture 65 in the die 51. The vertical face 66 of an upwardly-extending projection 67 on the die 51 forms the second upright of the U-shaped aperture 65. A downwardly-extending male member 68 provided on the punch 50 is adapted to fit within the aperture 65 with the vertical side 69 of the male member 68 further from the rod 60 contiguous to the vertical face 66 of the U-shaped aperture 65 as the punch 50 and die 51 are reciprocated toward each other. The bottom face 70 of the male member 68 is inclined to the horizontal to form a shearing edge 71 at the intersection with the vertical side 69. The vertical side 72 of the male member 68 nearer the rod 60 is spaced from the wall 64 by at least the thickness of the resistor lead 49. The contiguous vertical side 69 and vertical face 66 are spaced from the recess 59 according to the predetermined length which it is desired to cut the lead 49. The cooperating slide 52 and the rod 60 resiliently support the resistor 11 in the recess 59 with the lead 49 against the top surfaces of the slide 52 and the projection 67 and thus stretched across the U-shaped aperture 65. As the punch 50 and die 51 reciprocate toward each other, the lead 49 is sheared by the shearing edge 71 against the upper surface of the projection 67. Continued reciprocation of the punch 50 and die 51 causes the inclined bottom surface 70 of the male member 68 to bend the predetermined length downward and toward the vertical wall 64. Further reciprocation of the punch 50 and die 51 toward each other causes the rod 60 to move upwardly against the compression in the spring 62 and also causes the male member 68 to confine the predetermined length in the space between the vertical wall 64 and the side 72, thereby forming a right-angle bend 73 in the lead 49.

A slidable member 75 on the die 51 having its upper face on the same level as the upper surface of the slide 52 is movable horizontally of the vertical slide 52. The face of the slidable member 75 away from the slide 52 is inclined to the vertical, and a wedge 76 disposed between the slidable member 75 and an upwardly extending portion 78 of the die 51 is adapted to force the slidable member 75 against the slide 52 if a downward force is applied against the wedge 76. The upper portion of the vertical face 77 of the slidable member 75 adjacent the slide 52 is cut away to provide a vertical gap 79 between the slide 52 and the slidable member 75 at least as wide as the thickness of the lead 15 when the slidable member 75 is against the slide 52.

The flat loop 27 in the lead 15 rests against the upper horizontal surface of the slidable member 75 when the resistor 11 is supported in the recess 59 by the cooperating slide 52 and rod 60. A horizontal surface 82 and the bottom surface 80 of a downwardly extending projection 81 on the punch 50 are coplanar. The projection 81 is spaced from the punch 50 by more than the diameter of the retaining portion 63 of the rod 60 in order to allow the rod 60 to move upward against the force of the spring 62 as the punch 50 and die 51 are reciprocated toward each other. The bottom surface 80 and the horizontal surface 82 are adapted to abut against the upper surface of the slide 52 on opposite sides of the recess 59 as the rod 60 moves upward when the punch 50 and die 51 are reciprocated closer together. A vertical face 84 of the projection 81 away from the rod 60 is parallel to and spaced from the vertical face 77 of the slidable member 75 by more than the thickness of the lead 15. When the resistor 11 is supported in the recess 59 between the slide 52 and the retaining portion 63, the bottom surface 80 of the projection 81 and the horizontal surface 82 press those portions of the leads 15 and 49 adjacent the body of the resistor 11 against the upper face of the slide 52 as the punch 50 and die 51 reciprocate toward each other. Further reciprocation of these members depresses the slide 52 vertically downward against the compression of the spring 54. Downward movement of the slide 52 with the surface 80 pressing a portion of the lead 15 against the top face of the slide 52 and with the flat loop 27 against the upper face of the slidable member 75 causes the lead 15 to bend around the projection 81 into the gap 79 between the vertical surface 77 and the vertical surface 84 on the projection 81. A post 85 extending downwardly from the punch 50 is forced against the wedge 76 near the end of the cycle of reciprocation of the punch 50 and die 51. The wedge 76 drives the slidable member 75 against the slide 52 and forces the bent portion of the lead 15, including the loop 27, into the narrow gap 79 between the surfaces 77 and 84 to form a right angle bend 87 in the lead 15 in an opposite direction from the right angle bend 73 formed in the lead 49. The resistor 11 with the resulting two right angle bends is shown in Fig. 3C. Fig. 8 illustrates the operated position of the mating punch 50 and die 51 when they have been fully reciprocated toward each other.

In operation, a resistor 11 with a flat loop 27 formed therein is placed in the recess 59 where it is supported resiliently between the cooperating slide 52 and rod 60 with the unformed lead 49 resting against the upper surfaces of the slide 52 and the projection 67 and stretched across the U-shaped aperture 65 in the die 50, and with the flat loop 27 resting against the upper face of the slidable member 75.

As the punch 50 and die 51 are reciprocated toward each other, the shearing edge 71 of the male member 68 shears the lead 49 to a predetermined length against the upper face of the projection 67. Upon further reciprocation, the inclined bottom face 70 of the male member 68 presses the predetermined length downward and against the vertical wall 64 of the slide 52. Continued reciprocation of the punch 50 and die 51 causes the rod 60 to move upward against the compression of the spring 62 with the cylindrical portion 63 fitting between the downwardly extending projection 81 and the portion of the punch 50 having the horizontal surface 82. The slide 52 is depressed downwardly against the compression of the spring 54 after the horizontal surfaces 80 and 82 press the portions of the leads 15 and 49 adjacent the body of the resistor 11 against the upper surface of the slide 52.

As the slide 52 is moved downwardly under the forces partially transmitted through the bottom surface 80 of the projection 81 against the lead 15, the flat loop 27 resting against the upper surface of the slidable member 75 is bent upward into the gap 79 between the vertical surface 77 on the slidable member 75 and the vertical surface 84 on the projection 81. Near the end of the reciprocation of the punch 50 and the die 51 toward each other, the post 85 forces the wedge 76 downward, thereby driving the slidable member 75 toward the projection 81. The vertical surfaces 77 and 84 are thereby forced close together forming a right angle bend 87 in the lead 15. The resulting right angle bends 73 and 87 formed in the leads 15 and 49 are illustrated in Fig. 3C.

Means for reciprocating the punch 50 and the die 51 toward each other are omitted from the drawings and are not herein described, it being understood that any well known manual or automatic driving means may be utilized to obtain the desired movement of these mating members toward and away from each other.

While the embodiment of the present invention as herein described constitutes a preferred form, it is to be understood that other forms might be adopted, all within the scope of the claims which follow.

I claim:

1. A device for severing one electrical lead of a cylindrical component to a predetermined length and for forming right angle bends in the predetermined length and in a second lead, comprising a base having a horizontal surface, a slide resiliently mounted for movement vertically of said base and having its upper surface in the same plane as and spaced from said horizontal surface by at least the thickness of a lead, said base having a U-shaped opening therein with a portion of the slide away from said horizontal surface forming an upright first wall of said opening, a forming member reciprocable vertically of said base and having a first downwardly extending male portion spaced from said first upright wall by at least the thickness of a lead and adapted to fit into said U-shaped opening with a snug fit against the second upright wall of the U-shaped opening, and resiliently mounted means on said forming member cooperating with said slide for supporting the body of said component against the upper surface of said slide with a first lead of the component on said horizontal surface and with a second lead stretched across said U-shaped opening with the body of the component a predetermined distance from the second upright wall, said forming member having a second downwardly extending portion spaced from said horizontal surface by at least the thickness of a lead and adapted to press the portion of the first lead adjacent said body against the upper surface of said slide when said forming member is reciprocated toward said base, whereby when said forming means is reciprocated toward said base the second lead is severed by said first downwardly extending portion at said second upright wall and is bent downward against said first upright wall, and said second downwardly extending portion forces said slide downward past the horizontal surface and bends the first lead upward around said second downwardly extending portion.

2. A device for severing one electrical lead of a cylindrical component to a predetermined length and for forming right angle bends in opposite directions in the predetermined length and in a second lead, comprising a pair of mating members reciprocable toward each other, cooperating support means on said mating members for resiliently supporting said component, cooperating shearing and forming means on said mating members spaced a predetermined distance from said support means for severing a first lead of said component and bending the predetermined length thereof downward perpendicular to the axis of the component as said mating members are reciprocated toward each other, cooperating bending means on said mating members for bending the second lead upward perpendicular to the axis of the component as said mating members are reciprocated toward each other, and means for reciprocating said mating members toward each other.

3. A device for severing to a predetermined length one axial lead of an electronic component having a body and two axial leads and for forming bends in opposite directions in the cut lead and in the other lead, comprising cooperating male and female die members reciprocable vertically toward each other, a slide supported on and slidably movable toward said female die, spring means for resiliently urging said slide away from said female die, a holding member slidably mounted on said male die in alignment with said slide and cooperating therewith to retain the body of said component therebetween, spring means for urging said holding member away from said male die and towards said slide, a vertically pendant member on said male die adapted to engage the portion of a first axial lead adjacent said component body and to press said portion against said slide during the initial reciprocation of said dies toward each other and to urge said slide into said female die upon further reciprocation, means including cooperating shearing elements on said dies spaced a predetermined distance from said slide for shearing the second axial lead to a predetermined length and cooperating forming elements on said dies for deforming said cut lead downward upon reciprocation of said dies toward each other, means including a surface in the path of said first lead when said slide is moved into said female die and spaced at least the thickness of said lead from said slide for bending said first lead upward when said slide is moved into said female die, means associated with said surface and arranged normally thereto and positioned on the opposite side of said bent-up lead from said vertically pendant member and moveable laterally towards said pendant member upon still further reciprocation of said dies toward each other for pressing said first lead against said vertically pendant member to complete the bending of said first lead, and means for reciprocating said dies toward each other.

References Cited in the file of this patent

UNITED STATES PATENTS

| | | |
|---|---|---|
| 189,264 | Reynolds | Apr. 3, 1877 |
| 517,775 | Steinmann | Apr. 3, 1894 |
| 520,864 | Reynolds | June 5, 1894 |
| 582,283 | Grimes | May 11, 1897 |
| 718,961 | Yeatman et al. | Jan. 20, 1903 |
| 1,583,321 | Smith | May 4, 1926 |
| 1,607,401 | Johnson | Nov. 16, 1926 |
| 2,458,536 | Sherman | Jan. 11, 1949 |